US011999014B2

(12) United States Patent
He et al.

(10) Patent No.: US 11,999,014 B2
(45) Date of Patent: Jun. 4, 2024

(54) LASER CUTTING SYSTEM (71) Applicant: Medtronic, Inc., Minneapolis, MN (US)

(72) Inventors: Xiangnan He, Chandler, AZ (US); David A. Ruben, Mesa, AZ (US); Mark E. Henschel, Phoenix, AZ (US); Chunho Kim, Phoenix, AZ (US); Yongqian Wang, Chandler, AZ (US); Rodney D. Toles, Surprise, AZ (US)

(73) Assignee: Medtronic, Inc., Minneapolis, MN (US)

( * ) Notice: Subject to any disclaimer, the term of this patent is extended or adjusted under 35 U.S.C. 154(b) by 356 days.

(21) Appl. No.: 17/086,946

(22) Filed: Nov. 2, 2020

(65) Prior Publication Data
US 2021/0154772 A1 May 27, 2021

Related U.S. Application Data (60) Provisional application No. 62/939,320, filed on Nov. 22, 2019.

(51) Int. Cl.
*B23K 26/38* (2014.01)
*B23K 26/06* (2014.01)
(Continued)

(52) U.S. Cl.
CPC .......... *B23K 26/38* (2013.01); *B23K 26/0643* (2013.01); *B23K 26/082* (2015.10);
(Continued)

(58) Field of Classification Search
CPC .... B23K 26/38; B23K 26/082; B23K 26/705; B23K 26/0643; B23K 26/362; B23K 2101/38; H05K 2203/0207
See application file for complete search history.

(56) References Cited

U.S. PATENT DOCUMENTS 5,386,430 A * 1/1995 Yamagishi ........... B23K 26/032
219/121.68
8,964,801 B2  2/2015 Reid et al.
(Continued)

FOREIGN PATENT DOCUMENTS

EP   1386689      2/2004
GB   1336806 A  * 11/1973  ......... B23K 26/0643
(Continued)

OTHER PUBLICATIONS

WO-0041447-A1 (Widmer Thomas) Jul. 13, 2000 [retrieved on Jan. 23, 2024]. Retrieved from Espacenet Database, translation by EPO and Google. (Year: 2000) (Year: 2000).*
(Continued)

*Primary Examiner* — John J Norton
*Assistant Examiner* — Franklin Jefferson Wang
(74) *Attorney, Agent, or Firm* — Mueting Raasch Group (57) ABSTRACT

A system may include an emitting device and a controller. The emitting device may be adapted to emit a first laser beam and a second laser beam. The controller may include one or more processors and may be operably coupled to the emitting device to control emission of the first and second laser beams. The controller may be adapted to remove a portion of a workpiece to form an exposed surface of the workpiece with the first laser beam using the emitting device and to remove a portion of the exposed surface with the second laser beam using the emitting device.

21 Claims, 10 Drawing Sheets (51) Int. Cl.
*B23K 26/082* (2014.01)
*B23K 26/362* (2014.01)
*B23K 26/70* (2014.01)
*B23K 101/38* (2006.01)

(52) U.S. Cl.
CPC .......... *B23K 26/362* (2013.01); *B23K 26/705* (2015.10); *B23K 2101/38* (2018.08); *H05K 2203/0207* (2013.01)

(56) References Cited

U.S. PATENT DOCUMENTS

| | | | |
|---|---|---|---|
| 10,118,250 B1 * | 11/2018 | Budd | ................... G01B 11/26 |
| 2003/0006221 A1 * | 1/2003 | Hong | ................. H01L 21/3043 219/121.72 |
| 2004/0164060 A1 * | 8/2004 | Maeda | ................ B23K 26/382 219/121.7 |
| 2005/0061779 A1 | 3/2005 | Blumenfeld et al. | |
| 2014/0021177 A1 * | 1/2014 | Koch | ................... B23K 26/361 219/121.69 |
| 2016/0315293 A1 | 10/2016 | You et al. | |
| 2019/0001442 A1 * | 1/2019 | Unrath | ................. B23K 26/703 |
| 2019/0009359 A1 * | 1/2019 | Soffer | ................. B23K 26/032 |
| 2020/0130107 A1 * | 4/2020 | Mochizuki | ......... B23K 26/0626 |
| 2020/0170121 A1 * | 5/2020 | Lecordier | ............ H05K 3/1216 |

FOREIGN PATENT DOCUMENTS

| | | | | |
|---|---|---|---|---|
| JP | 2001281582 A | * | 10/2001 | ............. B23K 26/06 |
| JP | 2015188908 A | * | 11/2015 | |
| KR | 20170106562 A | * | 9/2017 | |
| WO | WO-0041447 A1 | * | 7/2000 | ............. H05K 1/115 |

OTHER PUBLICATIONS

International Search Report and Written Opinion from PCT Application No. PCT/US2020/060323 dated Mar. 25, 2021, 10 pages.

* cited by examiner

LASER CUTTING SYSTEM

CROSS-REFERENCE TO RELATED APPLICATIONS

This application claims the benefit of U.S. Provisional Application No. 62/939,320, filed Nov. 22, 2019, the disclosure of which is incorporated by reference herein in its entirety.

FIELD

This disclosure generally relates to laser cutting and singulation of workpieces or printed circuit boards.

BACKGROUND

Lasers and laser beams may be utilized to cut and shape workpieces or printed circuit boards. Lasers beams may be emitted at intensities great enough to cut through workpieces such as printed circuit boards (PCBs) that may include metallic conductors. Traditional laser cutting methods and systems may, however, introduce unwanted current leakage in laser cut printed circuit boards with metallic conductors such as, e.g., embedded Cu or other electrically conductive metal layers.

SUMMARY

The techniques of this disclosure generally relate to systems and methods for laser cutting of workpieces such as PCBs, substrates, etc. One or more laser beams may be emitted to cut or remove a portion of a workpiece to expose a surface workpiece. Further, one or more laser beams may be emitted to remove an additional portion of the workpiece or to remove material from the exposed surface of the workpiece. In one example, conductive material or particles may be removed from the exposed surface of the workpiece.

In one aspect, the present disclosure provides a method that includes removing a portion of a workpiece with a first laser beam to form an exposed surface of the workpiece, and removing a portion of the exposed surface of the workpiece with a second laser beam.

In another aspect, the present disclosure provides a system including an emitting device and a controller including one or more processors. The emitting device may be adapted to emit a first laser beam and a second laser beam. The controller may be operably coupled to the emitting device to control emission of the first and second laser beams. The controller may be adapted to remove a portion of a workpiece to form an exposed surface of the workpiece with the first laser beam using the emitting device. The controller may further be adapted to remove a portion of the exposed surface with the second laser beam using the emitting device.

All headings provided herein are for the convenience of the reader and should not be used to limit the meaning of any text that follows the heading, unless so specified.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements.

In this application, terms such as "a," "an," and "the" are not intended to refer to only a singular entity but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

The details of one or more aspects of the disclosure are set forth in the accompanying drawings and the description herein. Other features, objects, and advantages of the techniques described in this disclosure will be apparent from the description and drawings, and from the claims.

DETAILED DESCRIPTION

Exemplary techniques, apparatus, and systems shall be described with reference to FIGS. 1-10. It will be apparent to one skilled in the art that elements or processes from one embodiment may be used in combination with elements or processes of the other embodiments, and that the possible embodiments of such techniques, apparatus, and systems using combinations of features set forth herein is not limited to the specific embodiments shown in the Figures and/or described herein. Further, it will be recognized that the embodiments described herein may include many elements that are not necessarily shown to scale. Still further, it will be recognized that timing of the processes and the size and shape of various elements herein may be modified but still fall within the scope of the present disclosure, although certain timings, one or more shapes and/or sizes, or types of elements, may be advantageous over others.

In general, the present disclosure describes various embodiments of a laser cutting system and method that may be adapted to remove portions of a workpiece and prevent unwanted current leakage. As used herein the term "workpiece" may include substrates, printed circuit boards (PCBs), packages, conductors, insulators, multilayer boards, etc. A workpiece may include any suitable materials such as, e.g., sapphire, silicon, metallic conductors, etc.

Figure 1:
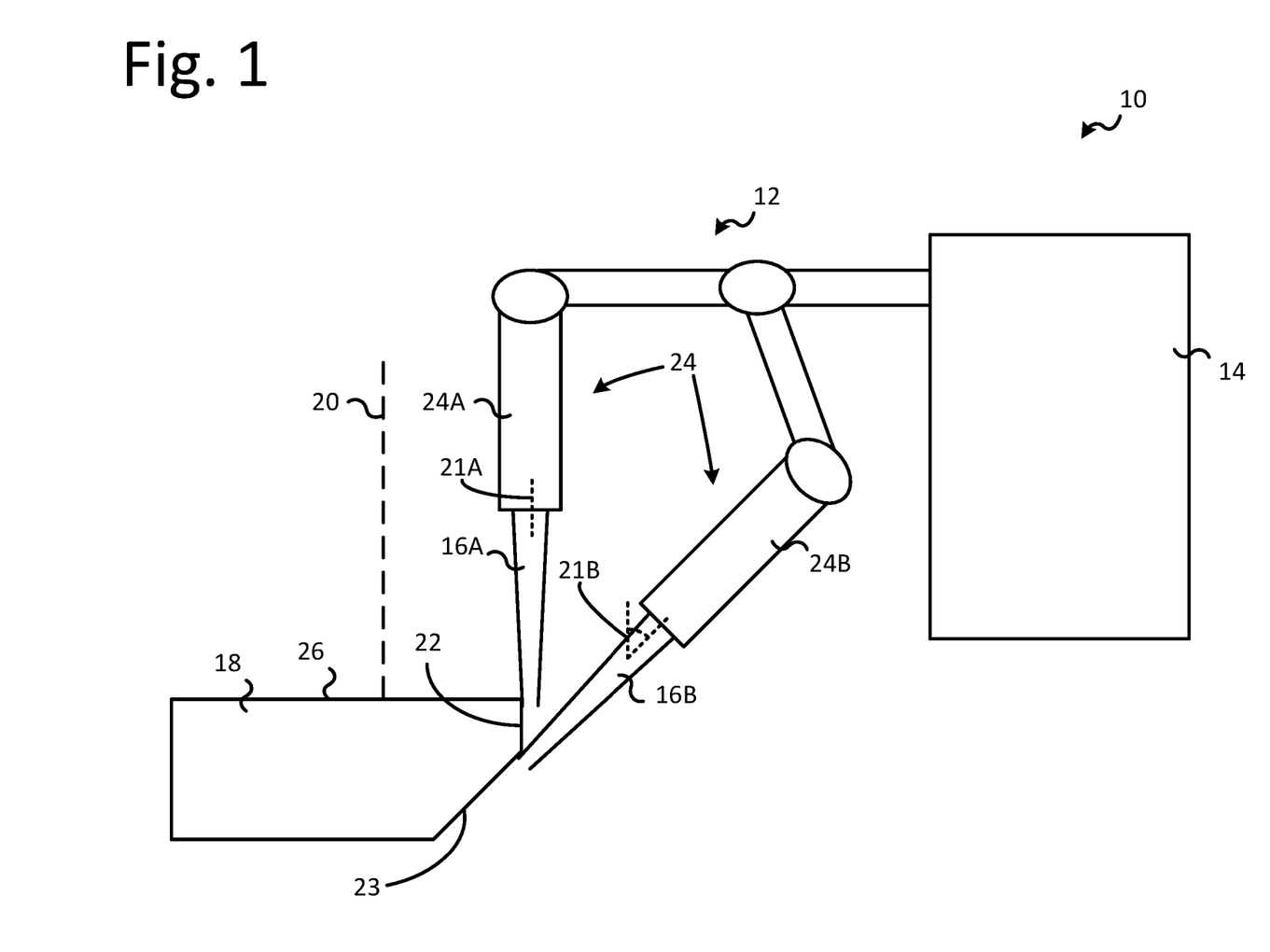
FIG. 1 is a schematic side view of one embodiment of a laser cutting system.

FIG. 1 is a schematic side view of one embodiment of a laser cutting system 10. The laser cutting system 10 may include an emitting device 12 and a controller 14. The emitting device 12 may be adapted to emit a first laser beam 16A and a second laser beam 16B. The controller 14 may include one or more processors and may be operably coupled to the emitting device 12 to control emission of the first and second laser beams 16A and 16B. The controller 14 may be adapted to remove a portion of a workpiece 18 to form an exposed surface 22 of the workpiece with the first laser beam 16A using the emitting device 12 and to remove a portion of the exposed surface with the second laser beam 16B using the emitting device.

The workpiece 18 may include materials such as, e.g., conductors, insulators, sapphire, silicon, metals, etc. The workpiece 18 may include any suitable layered structures of different materials such as, e.g., copper routing layers, ground layers, power layers, insulating layers, etc. The workpiece 18 may take on any suitable size, shape, and/or dimensions.

The emitting device 12 may include any suitable apparatus or device for directing emitted electromagnetic radiation, e.g., laser beams 16A and 16B. The emitting device 12 may include, e.g., motors, arms, sensors, etc. The emitting device 12 may include one or more emitters 24 such as, e.g., first emitter 24A and second emitter 24B. Emitters 24 may include any suitable apparatus or device adapted to emit electromagnetic radiation such as, e.g., one or more diodes, crystals, lenses, optical devices, power sources, etc.

The controller 14 may include any suitable apparatus or device for controlling emitting device 12 to cut, clean, shape, engrave, or singulate the workpiece 18. The controller 14 may include one or more processors, memory, input devices, output devices, sensors, power sources, etc.

Each of the first and second laser beams 16A and 16B may be emitted at any intensity or wavelength suitable for cutting, cleaning, shaping, engraving, or removing material from the workpiece 18. The controller 14 may be adapted to control the emitting device 12 to emit the second laser beam 16B at a lower intensity or higher intensity than the first laser beam 16A. Additionally, the controller 14 may be adapted to control the emitting device 12 to emit the second laser beam 16B at a different wavelength than the first laser beam 16A. The first laser beam 16A may be used to cut or shape the workpiece 18 to form an exposed surface 22 of the workpiece. The second laser beam 16B may be emitted at a lower intensity to clean or further shape or clean the exposed surface 22. To clean the exposed surface 22, the second laser beam 16B may remove impurities, conductive particles, shavings, burrs, or other undesired materials from the exposed surface 22. Further, each of the first and second laser beams 16A and 16B can have any suitable pulse durations. For example, the first laser beam 16A can have a pulse duration of a nanosecond, and the second laser beam 16B can have a pulse duration of a picosecond. Such pulse durations can be optimized for the materials of the workpiece 18.

The laser beam 16B may be used to cut or remove a portion of exposed surface 22 to form an angled or inclined surface 23. The laser beam 16B may remove a portion of material from exposed surface 22 to make the exposed surface 22 parallel to a normal 20 to a major surface 26. The controller 14 may be adapted to control the emitting device 12 to emit the first laser beam 16A at a first angle 21A relative to the normal 20 to the major surface 26 of the workpiece 18 and the second laser beam 16B at a second angle 21B relative to the normal 20 to the major surface 26 of the workpiece. The first angle 21A may be in a range of about 0 degrees to about 90 degrees. In one example, the first angle 21A is no greater than 10 degrees.

In one example, emitting device 12 may include the single emitter 24A that emits the first and second laser beams 16A and 16B. In another example, emitting device 12 may include the first emitter 24A and the second emitter 24B. The first emitter 24A may be adapted to emit the first laser beam 16A. The second emitter 24B may be adapted to emit the second laser beam 16B. The emitters 24A and 24B may be controlled or moved independently by the controller 14. The emitters 24A and 24B may be adapted to emit the first and second laser beams 16A and 16B at different intensities or wavelengths.

Figure 2:
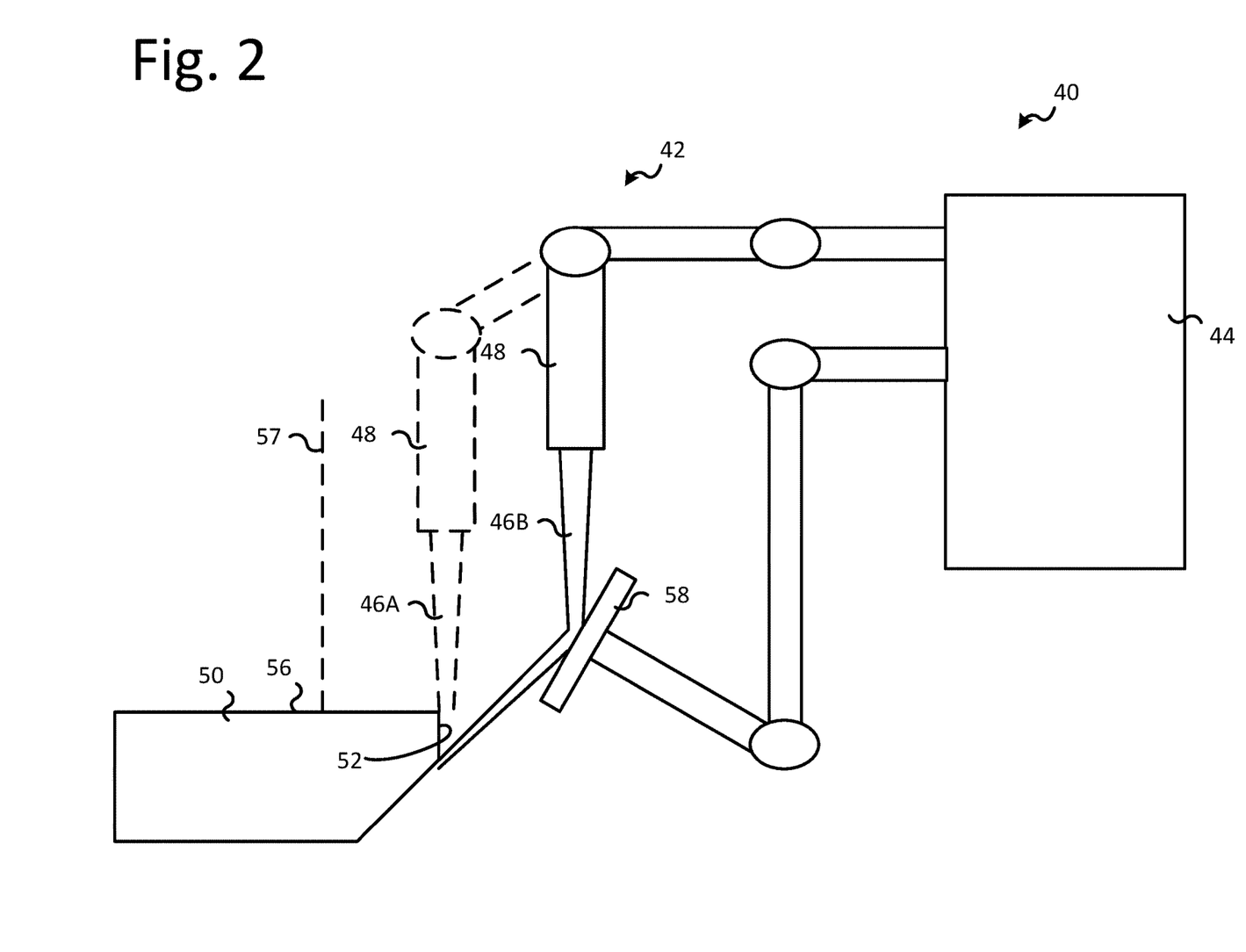
FIG. 2 is a schematic side view of another embodiment of a laser cutting system.

FIG. 2 is a schematic side view of another embodiment of a laser cutting system 40. All of the design considerations and possibilities regarding the laser cutting system 10 of FIG. 1 apply equally to the laser cutting system 40 of FIG. 2. The laser cutting system 40 may include an emitting device 42 adapted to emit a first laser beam 46A and a second laser beam 46B. The laser cutting system 40 may include a controller 44 including one or more processors and operably coupled to the emitting device 42 to control emission of the first laser beam 46A and the second laser beam 46B. The controller 44 may be further adapted to remove a portion of a workpiece 50 to form an exposed surface 52 of the workpiece with the first laser beam 46A using the emitting device 42. The controller may be adapted to remove a portion of the exposed surface 52 with the second laser beam 46B using the emitting device 42.

In one example, emitting device 42 may include a single emitter 48 that emits the first laser beam 46A and the second laser beam 46B. The laser cutting system 40 may further include a mirror 58. The controller 44 may be adapted to control the emitting device 42 to direct at least one of the first laser beam 46A and the second laser beam 46B to the mirror 58. The mirror 58 may be adapted to direct at least one of the first laser beam 46A and second laser beam 46B to the workpiece 50. The controller 44 may be operably coupled to the mirror 58 to control an angle of the mirror. The angle of the mirror 58 may be controllable to change an angle of the second laser beam 46B relative to a normal 57 to a major surface 56 of the workpiece 50. The angle of the mirror 58 may be controllable to change an angle of any laser beam emitted by the emitting device 42. The mirror 58 may include any suitable reflective material, for example, the mirror may include glass with a thin layer of silver, or a stack-up of many thin layers of some dielectric or polymeric material, or other materials or layers to form a reflective surface. The first laser beam 46A and the second laser beam 46B may be emitted to do work simultaneously or to do work in series. The first laser beam 46A and the second laser beam 46B may each be emitted at various power levels, wavelengths, and intensities.

Figure 3:
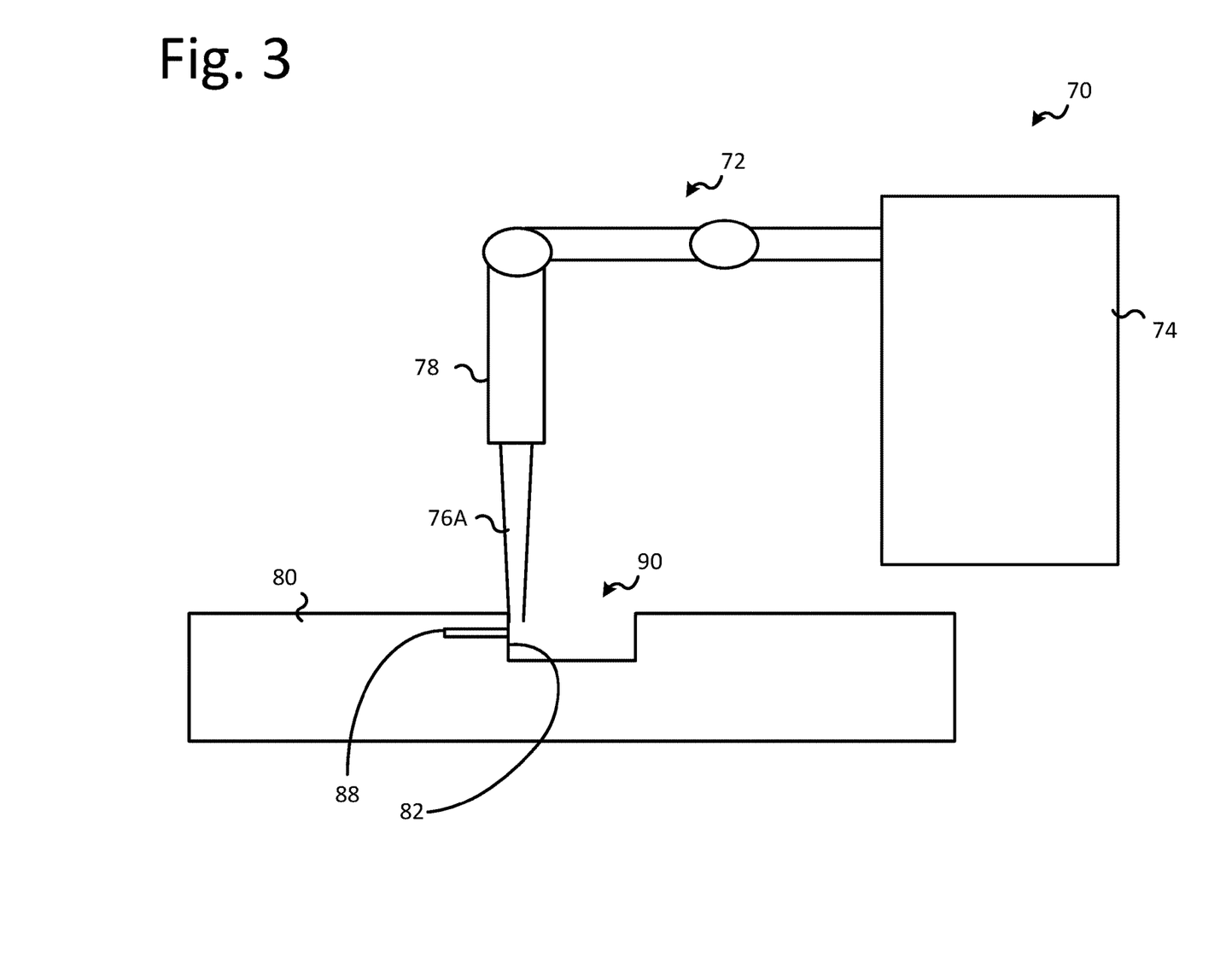
FIG. 3 is a schematic side view of another embodiment of a laser cutting system.
Figure 4:
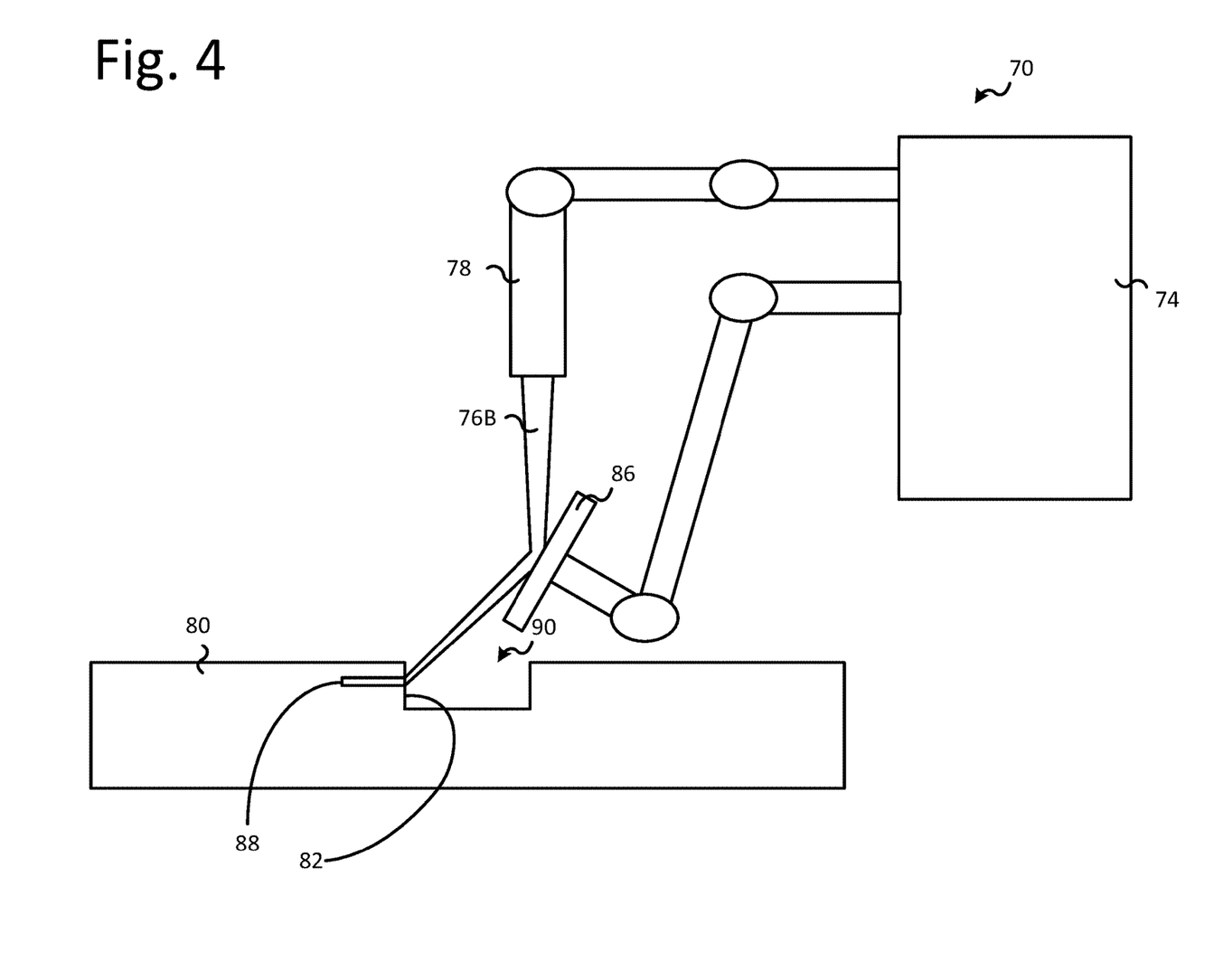
FIG. 4 is another schematic side view of the laser cutting system of FIG. 3.

FIGS. 3 and 4 are schematic side views of another embodiment of a laser cutting system 70. All of the design considerations and possibilities regarding the laser cutting systems 10 and 40 of FIGS. 1 and 2 apply equally to the laser cutting system 70 of FIGS. 3 and 4. The laser cutting system 70 may include an emitting device 72 adapted to emit a first laser beam 76A and a second laser beam 76B. The laser cutting system 70 may further include a controller 74 including one or more processors and operably coupled to the emitting device 72 to control emission of the first and second laser beams 76A and 76B. The controller 74 may be adapted to remove a portion of a workpiece 80 to form an exposed surface 82 of the workpiece with the first laser beam 76A using the emitting device 72. The controller 74 may further be adapted to remove a portion of the exposed surface 82 with the second laser beam 76B using the emitting device 72.

Removal of the portion of the workpiece 80 may include disposing a recess or engraving 90 in the workpiece. The first laser beam 76A may not cut entirely through the workpiece 80. Instead, the recess 90 or cavity may be disposed in the workpiece 80. The exposed surface 82 may be a surface inside the recess 90. The workpiece 80 may also include one or more conductors 88. The one or more conductors 88 may include any suitable conductive material such as, e.g., copper, gold, aluminum, sliver, etc.

The one or more conductors 88 may be exposed in the recess 90 by removal of the portion of the workpiece 80. Exposure of the one or more conductors 88 via laser cutting may result in conductive residue or particles being deposited or dispersed on the exposed surface 82. Conductive residue or particles deposited on the exposed surface 82 may be a source of unwanted current leakage or other electrically parasitic effects. Removal of the conductive residue or particles from the exposed surface 82 may prevent such current leakage or electrically parasitic effects. The conductive residue or particles may be removed from the exposed surface 82 using the second laser beam 76B.

In one or more embodiments, the laser cutting system 70 may further include a mirror 86 as shown in FIG. 4. The mirror 86 may be adapted to reflect, direct, or angle laser beams such as first and second laser beams 76A and 76B. The mirror 86 may be adapted to angle or direct the second laser beam 76B to the exposed surface 82.

Figure 5:
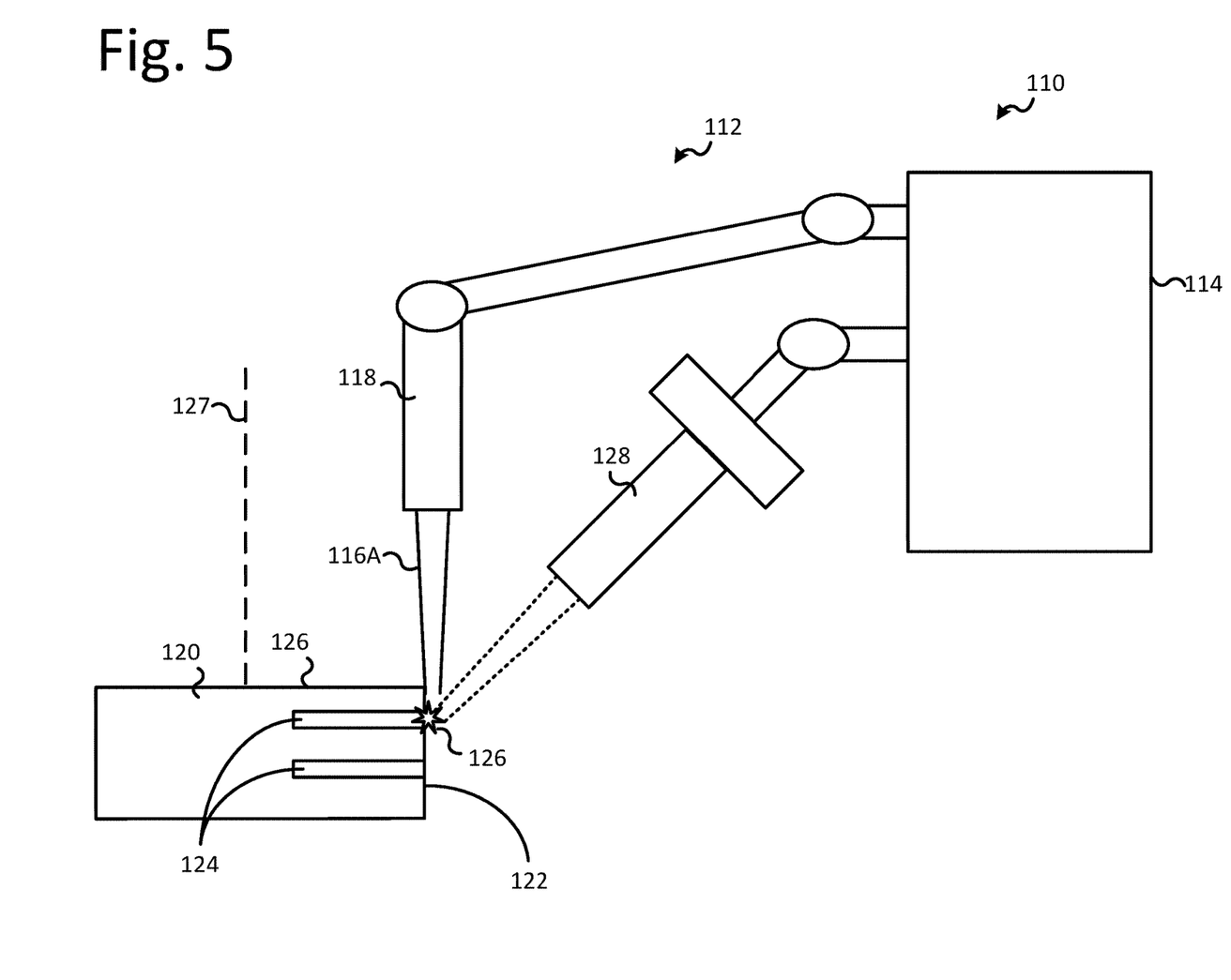
FIG. 5 is a schematic side view of another embodiment of a laser cutting system.
Figure 6:
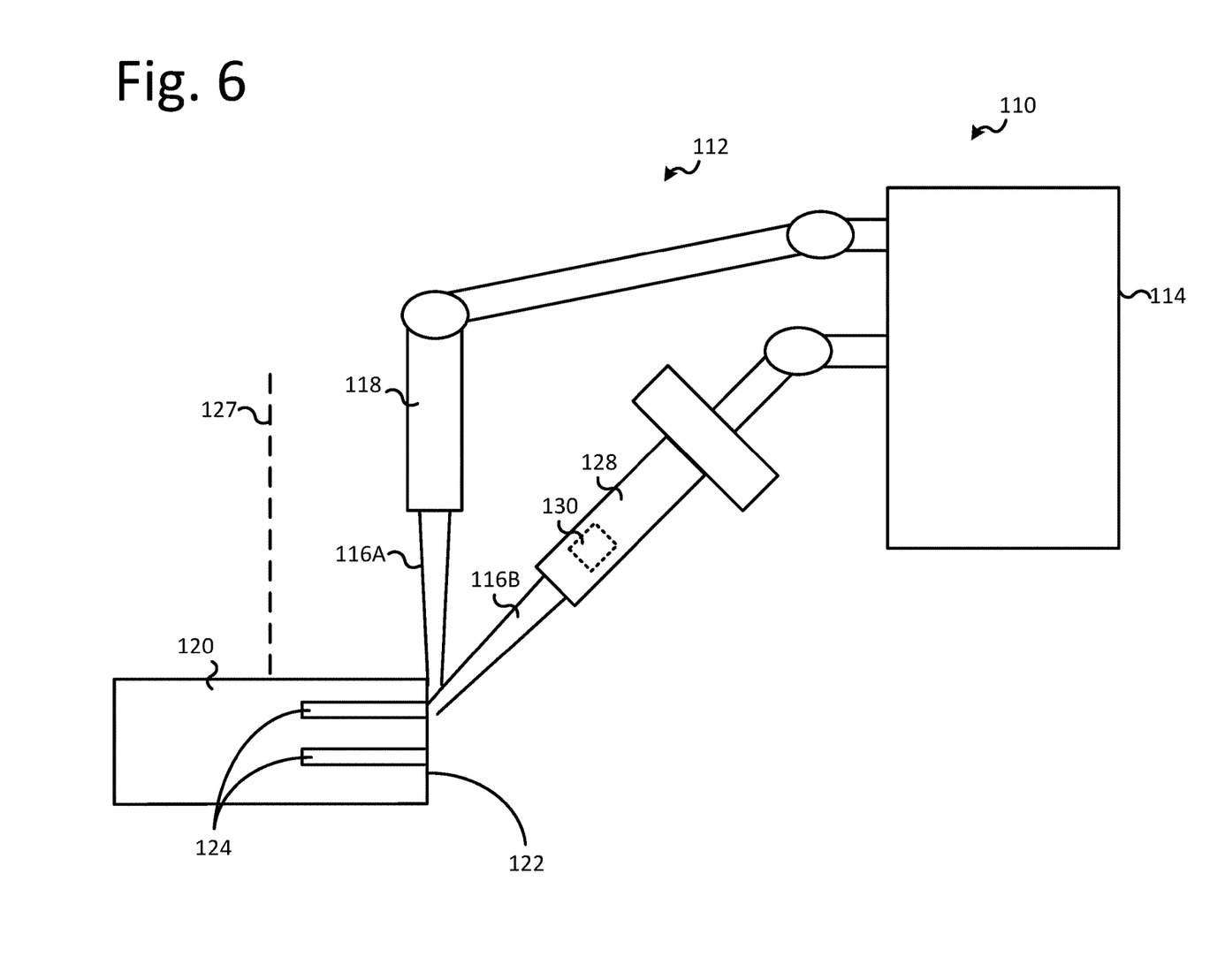
FIG. 6 is another schematic side view of the laser cutting system of FIG. 5.

FIGS. 5 and 6 are schematic side views of another embodiment of a laser cutting system 110. All of the design considerations and possibilities regarding the laser cutting systems 10, 40, and 70 of FIGS. 1-4 apply equally to the laser cutting system 110 of FIGS. 5 and 6. The laser cutting system 110 may include an emitting device 112 adapted to emit a first laser beam 116A and a second laser beam 116B. The laser cutting system 110 may further include a controller 114 including one or more processors and operably coupled to the emitting device 112 to control emission of the first and second laser beams 116A and 116B. The controller 114 may be adapted to remove a portion of a workpiece 120 to form an exposed surface 122 of the workpiece with the first laser beam 116A using the emitting device 112. The controller 114 may further be adapted to remove a portion of the exposed surface 122 with the second laser beam 116B using the emitting device 112.

The laser cutting system 110 may include an optical sensor 128 adapted to detect plasma illumination 126. Plasma illumination 126 detected by the optical sensor 128 may provide information about surfaces of the workpiece 120 including exposed surface 122. Information provided by the detected plasma illumination 126 may include the location of various materials such as conductors 124 on the workpiece 120 or cutting conditions for the second laser beam 116B. In one or more embodiments, the controller 114 may be adapted to determine a position of one or more conductors 124 on the exposed surface of the workpiece based on plasma illumination 126 emitted when the first laser beam 116A contacts the conductor.

In one or more embodiments, the optical sensor 128 may detect signals generated by the first laser beam 116A or the second laser beam 116B. The first laser beam 116A or the second laser beam 116B may be used to do spectroscopy. For example, the first laser beam 116A or the second laser beam 116B may strike a surface (e.g., the exposed surface 122) of the substrate and generate signals that can be detected by optical sensor 128 and used for chemical analysis of the surface.

Generally, the optical sensor 128 may include any one or more devices adapted to sense or measure a quantity or spectrum of light. For example, the optical sensor 128 may include photoconductive devices, photovoltaic devices, photodiodes, phototransistors, etc. The optical sensor 128 may receive light reflected from a surface of a workpiece and generate an electrical signal based on the received light. The optical sensor 128 may be adapted to detect plasma illumination such as plasma illumination 126. The controller 114 may be adapted to determine a position of the conductor 124 on the exposed surface 122 of the workpiece 120 based on plasma illumination 126 emitted when the first laser beam 116A contacts the conductor.

Additionally, the controller 114 may further be adapted to determine an angle relative to a normal 127 to a major surface 126 of the workpiece 120 to emit the second laser beam 116B based on the determined position of the conductor 124. Additionally, the controller 114 may further be adapted to etch a recess or engraving at the conductor 124 disposed on the exposed surface 122 of the workpiece 120. Furthermore, the controller 114 may be adapted to remove conductive particles or residue from the exposed surface 122 of the workpiece 120 with the second laser beam 116B.

The optical sensor 128 may further include an emitter 130 as shown in FIG. 6. The emitter 130 of the optical sensor 128 may be adapted to emit laser beams such as laser beam 116B. The emitter 130 of the optical sensor 128 may be adapted to cut, clean, shape, or otherwise remove a portion of the workpiece 120. The emitter 130 of the optical sensor 128 may further be adapted for use in optical sensing or measurement.

Figure 7:
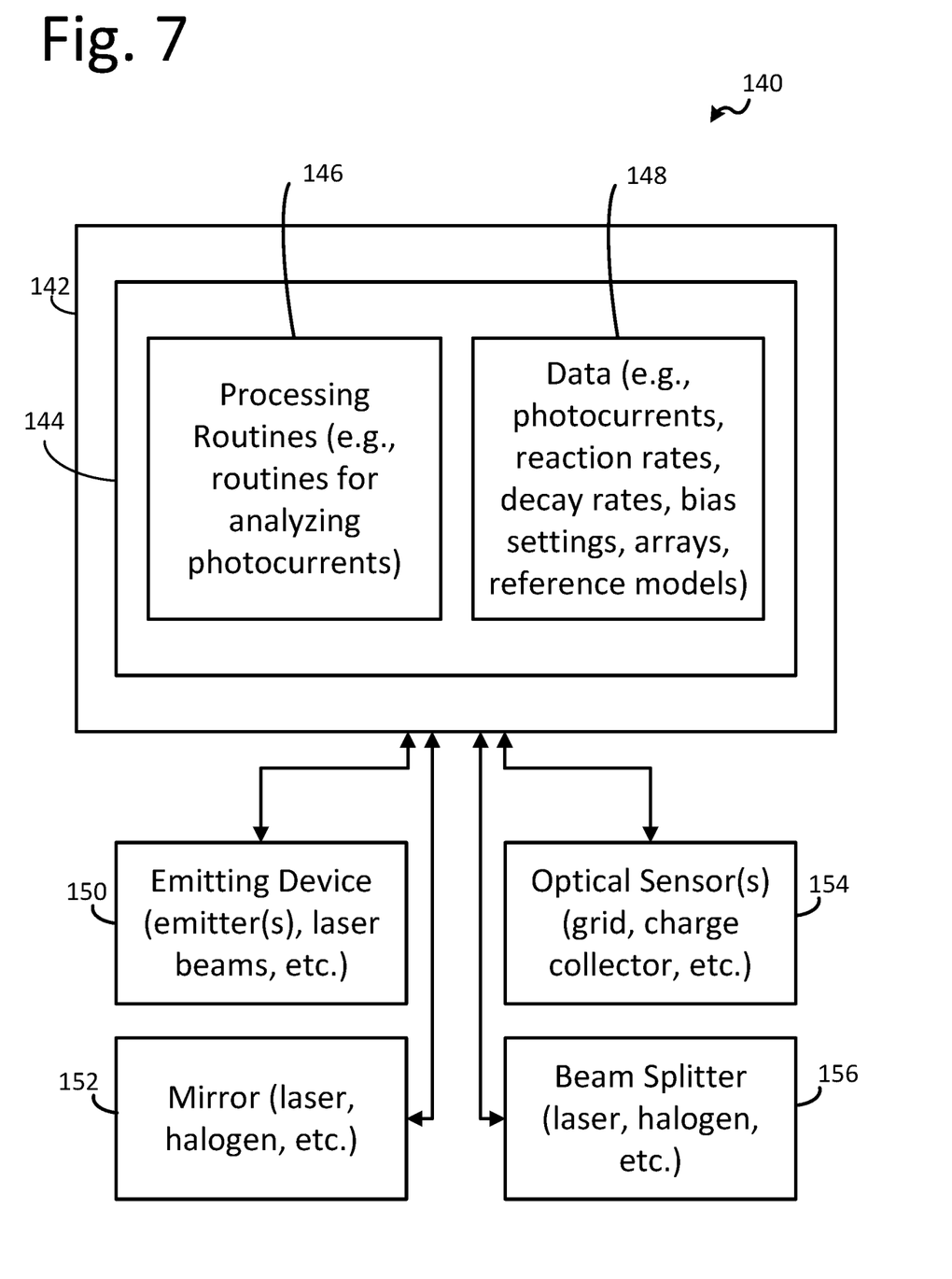
FIG. 7 is a schematic block diagram of one embodiment of a laser cutting system.

An exemplary schematic system block diagram of a laser cutting system 140 for use in removing a portion of a workpiece with a first and second laser beam is depicted in FIG. 7. All of the design considerations and possibilities regarding the laser cutting systems 10, 40, 70, and 110 of FIGS. 1-6 apply equally to the laser cutting system 140 of FIG. 7. The laser cutting system 140 may include a processing apparatus or processor 142 (e.g., controllers 14, 44, 74, or 114 of FIGS. 1-6) and an emitting device 150 (e.g., emitting devices 12, 42, 72, or 112 of FIGS. 1-6). Generally, the emitting device 150 may be operably coupled to the processing apparatus 142 and may include any one or more devices adapted to emit laser beams. The emitting device 150 may include any apparatus, structure, or device adapted to emit or position laser beams for removing one or more portions of a workpiece.

The laser cutting system 140 may additionally include a mirror 152 (e.g., mirror 58 or 86 of FIGS. 2 and 4) operably coupled to the processing apparatus 142. Generally, the mirror 152 may include any one or more devices adapted to reflect or angle laser beams.

The laser cutting system 140 may additionally include one or more optical sensors 154 (e.g., optical sensor 128 of FIGS. 5 and 6) operably coupled to the processing apparatus 142. Generally, the optical sensors 154 may include any one or more devices adapted sense or measure a quantity or spectrum of light. The optical sensors 154 may receive light reflected from a surface of a workpiece and generate an electrical signal based on the received light. The one or more optical sensors 154 may be adapted to detect plasma illumination. The processing apparatus 142 may be adapted to determine a position of a conductor on an exposed surface of a workpiece based on plasma illumination emitted when a laser beam contacts the conductor. Additionally, the processing apparatus 142 may be adapted to determine an angle relative to a normal to a major surface of the workpiece to emit a laser beam based on the determined position of the conductor.

The laser cutting system 140 may additionally include a beam splitter 156 operably coupled to the processing apparatus 142. The beam splitter 156 may include an apparatus or device to split a laser beam into two or more laser beams. The beam splitter 156 may include, for example, a partially reflective mirror, a prism, a beam splitter cube, etc. The processing apparatus 142 may be adapted to control the emitting device 150 to emit a first and second laser beam simultaneously using the beam splitter 156.

Further, the processing apparatus 142 includes data storage 144. Data storage 144 allows for access to processing programs or routines 146 and one or more other types of data 148 that may be employed to carry out the exemplary techniques, processes, and algorithms of removing one or more portions of a workpiece with the laser cutting system 140. For example, processing programs or routines 146 may include programs or routines for performing computational mathematics, matrix mathematics, Fourier transforms, compression algorithms, calibration algorithms, image construction algorithms, inversion algorithms, signal processing algorithms, normalizing algorithms, deconvolution algorithms, averaging algorithms, standardization algorithms, comparison algorithms, vector mathematics, analyzing optical sensor data, analyzing laser singulation settings, controlling an emitting device, detecting workpiece surface defects, or any other processing required to implement one or more embodiments as described herein.

Data 148 may include, for example, position data (e.g., workpiece position, emitter position, mirror position, angles, etc.), laser singulation settings, thresholds, emitter settings, arrays, meshes, grids, variables, counters, statistical estimations of accuracy of results, results from one or more processing programs or routines employed according to the disclosure herein (e.g., detecting workpiece surface details, determining conductor position, etc.), or any other data that may be necessary for carrying out the one or more processes or techniques described herein.

In one or more embodiments, the laser cutting system 140 may be controlled using one or more computer programs executed on programmable computers, such as computers that include, for example, processing capabilities (e.g., microcontrollers, programmable logic devices, etc.), data storage (e.g., volatile or non-volatile memory and/or storage elements), input devices, and output devices. Program code and/or logic described herein may be applied to input data to perform functionality described herein and generate desired output information. The output information may be applied as input to one or more other devices and/or processes as described herein or as would be applied in a known fashion.

The programs used to implement the processes described herein may be provided using any programmable language, e.g., a high-level procedural and/or object orientated programming language that is suitable for communicating with a computer system. Any such programs may, for example, be stored on any suitable device, e.g., a storage media, readable by a general or special purpose program, computer or a processor apparatus for configuring and operating the computer when the suitable device is read for performing the procedures described herein. In other words, at least in one embodiment, the laser cutting system 140 may be controlled using a computer readable storage medium, configured with a computer program, where the storage medium so configured causes the computer to operate in a specific and predefined manner to perform functions described herein.

The processing apparatus 142 may be, for example, any fixed or mobile computer system (e.g., a personal computer or minicomputer). The exact configuration of the computing apparatus is not limiting and essentially any device capable of providing suitable computing capabilities and control capabilities (e.g., control the sound output of the laser cutting system 140, the acquisition of data, such as audio data or sensor data) may be used. Further, various peripheral devices, such as a computer display, mouse, keyboard, memory, printer, scanner, etc. are contemplated to be used in combination with the processing apparatus 142. Further, in one or more embodiments, the data 148 (e.g., sound data, voice data, hearing impairment settings, hearing device settings, an array, a mesh, a digital file, etc.) may be analyzed by a wearer, used by another machine that provides output based thereon, etc. As described herein, a digital file may be any medium (e.g., volatile or non-volatile memory, a CD-ROM, a punch card, magnetic recordable tape, etc.) containing digital bits (e.g., encoded in binary, trinary, etc.) that may be readable and/or writeable by processing apparatus 142 described herein. Also, as described herein, a file in wearer-readable format may be any representation of data (e.g., ASCII text, binary numbers, hexadecimal numbers, decimal numbers, audio, graphical) presentable on any medium (e.g., paper, a display, sound waves, etc.) readable and/or understandable by a wearer.

In view of the above, it will be readily apparent that the functionality as described in one or more embodiments according to the present disclosure may be implemented in any manner as would be known to one skilled in the art. As such, the computer language, the computer system, or any other software/hardware that is to be used to implement the processes described herein shall not be limiting on the scope of the systems, processes or programs (e.g., the functionality provided by such systems, processes or programs) described herein.

The techniques described in this disclosure, including those attributed to the systems, or various constituent components, may be implemented, at least in part, in hardware, software, firmware, or any combination thereof. For example, various aspects of the techniques may be implemented by the processing apparatus 142, which may use one or more processors such as, e.g., one or more microprocessors, DSPs, ASICs, FPGAs, CPLDs, microcontrollers, or any other equivalent integrated or discrete logic circuitry, as well as any combinations of such components, image processing devices, or other devices. The term "processing apparatus," "processor," or "processing circuitry" may generally refer to any of the foregoing logic circuitry, alone or in combination with other logic circuitry, or any other equivalent circuitry. Additionally, the use of the word "processor" may not be limited to the use of a single processor but is intended to connote that at least one processor may be used to perform the exemplary techniques and processes described herein.

Such hardware, software, and/or firmware may be implemented within the same device or within separate devices to support the various operations and functions described in this disclosure. In addition, any of the described components may be implemented together or separately as discrete but interoperable logic devices. Depiction of different features, e.g., using block diagrams, etc., is intended to highlight different functional aspects and does not necessarily imply that such features must be realized by separate hardware or software components. Rather, functionality may be performed by separate hardware or software components, or integrated within common or separate hardware or software components.

When implemented in software, the functionality ascribed to the systems, devices and techniques described in this disclosure may be embodied as instructions on a computer-readable medium such as RAM, ROM, NVRAM, EEPROM, FLASH memory, magnetic data storage media, optical data storage media, or the like. The instructions may be executed by the processing apparatus 142 to support one or more aspects of the functionality described in this disclosure.

Figure 8:
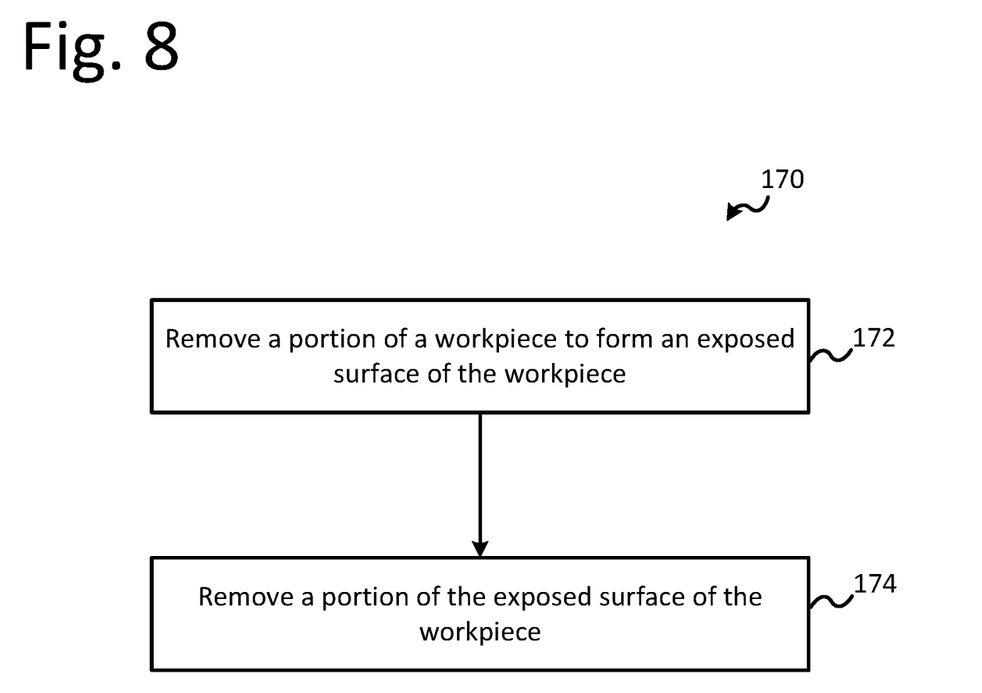
FIG. 8 is a schematic flow diagram of one embodiment of a laser singulation process.

FIG. 8 is a schematic flow diagram of one embodiment of method or process 170 for laser singulation. The laser cutting process 180 may be executed using a laser cutting system such as any one of the laser cutting systems of FIGS. 1-7. The process 170 may include removing a portion of a workpiece with a first laser beam to form an exposed surface of the workpiece at 172. The process 170 may further include removing a portion of the exposed surface of the workpiece with a second laser beam at 174.

Removing the portion of the workpiece at 172 may include disposing a recess in the workpiece. Furthermore, removing the portion of the workpiece at 172 may include cutting the workpiece into one or more singulated electronic packages. Still further, removing a portion of the exposed surface of the workpiece at 174 may include shaping the exposed surface. Shaping the exposed surface may include, for example, angling the surface, curving the surface, forming a pattern in the surface, etc. Shaping the exposed surface may be used to remove sharp corners or edges. Sharp corners and edges may be susceptible to cracking, chipping, or other damage that may decrease quality and reliability of workpieces. Accordingly, removal of sharp edges and corners may decrease the likelihood of cracking, chipping, or other damage and increase the quality and reliability of workpieces. Removing the portion of the exposed surface at 174 may include cleaning the exposed surface. Cleaning the exposed surface may include, for example, removing impurities, particles, conductors, or other materials from the exposed surface. In one example, cleaning the exposed surface includes removing conductive particles from the exposed surface. Furthermore, removing the portion of the exposed surface of the workpiece may include etching a recess at a conductor disposed on the exposed surface of the workpiece.

The second laser beam may be a lower intensity than the first laser beam. The first laser beam may be emitted by a first emitter and the second laser beam may be emitted by a second emitter. Alternatively, the first laser beam may be emitted by an emitter and the second laser beam may be emitted by the emitter and directed to the exposed surface by a mirror. An angle of the mirror may be controllable to change an angle of the second laser beam relative to a normal to a major surface of the workpiece.

In one example, the first laser beam may be emitted at a first angle relative to a normal to a major surface of the workpiece and the second laser beam may be emitted at a second angle relative to the normal to the major surface of the workpiece. The first angle may be in a range of about 0 degrees to about 20 degrees. In one example, the angle may be no greater than 10 degrees.

Figure 9:
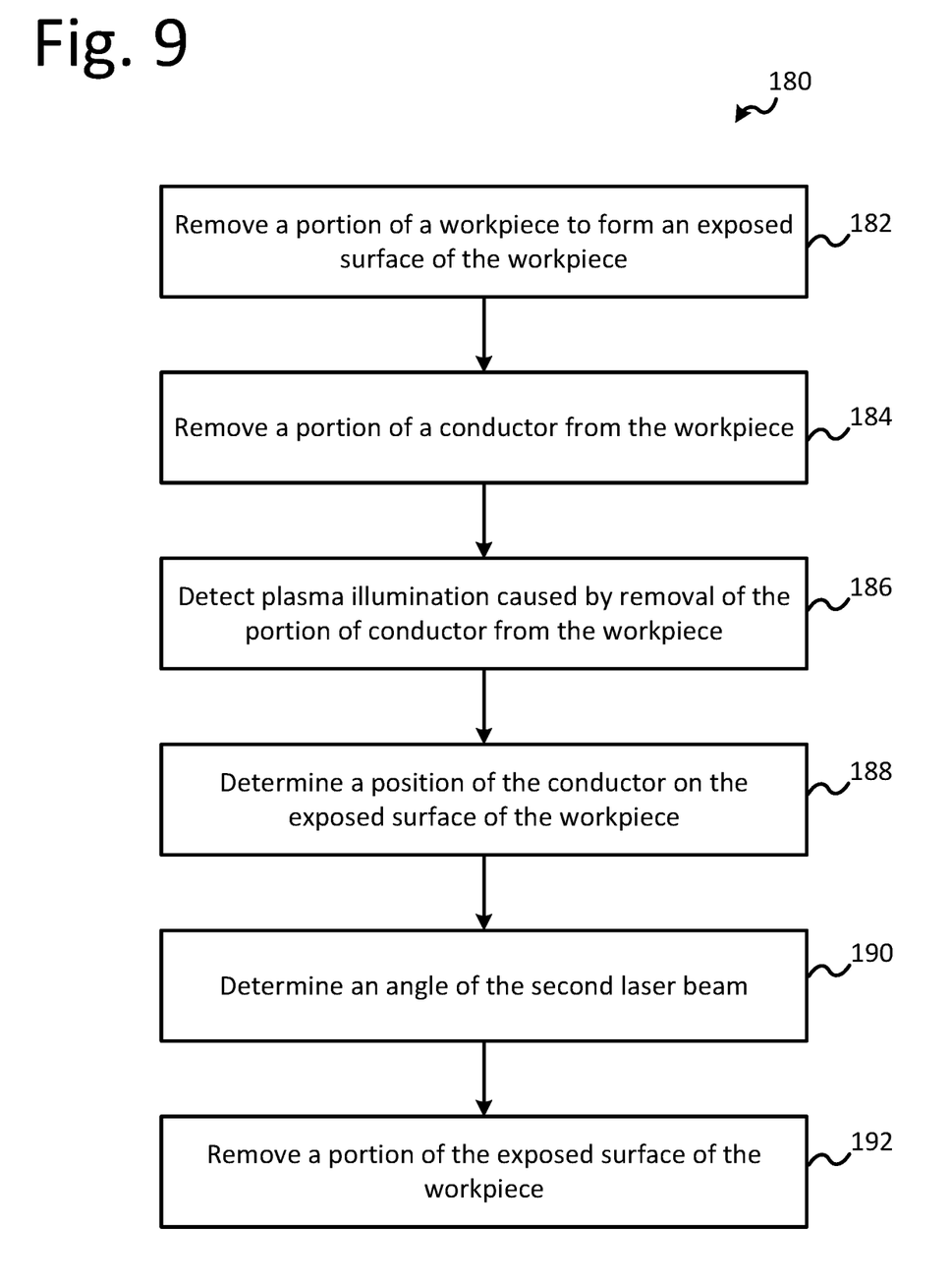
FIG. 9 is a schematic flow diagram of another embodiment of a laser singulation process.

FIG. 9 is a schematic flow diagram of another embodiment of a method or process 180 for laser singulation. The laser singulation process 180 may be executed using a laser cutting system such as any one of the laser cutting systems of FIGS. 1-7. The process 180 may include removing a portion of a workpiece with a first laser beam to form an exposed surface of the workpiece at 182. Removing the portion of the workpiece at 182 may include disposing a recess in the workpiece. Removing the portion of the workpiece at 182 may include cutting the workpiece into one or more electronic packages.

The process 180 may further include removing a portion of a conductor from the workpiece with the first laser beam at 184. The portion of the conductor may be a conductive trace, a conductive layer, or other conductive element of a circuit board. The conductor may include any suitable conductive material, e.g., gold, copper, silver, aluminum, etc.

The process 180 may further include detecting plasma illumination caused by removal of the portion of the conductor from the workpiece at 186. Plasma may be emitted when a laser beam contacts a conductor indicating a position of the conductor. The plasma illumination may be detected using an optical sensor. The process 180 may further include determining a position of the conductor on the exposed surface of the workpiece based on the detected plasma illumination at 188. The position of the conductor may be associated with the location that the plasma was emitted. The process 180 may further include determining an angle of the second laser beam based on the position of the conductor at 190. The angle of the second laser beam may further be determined based on a position of the emitter for emitting the second laser beam. The angle of the second laser beam may be in a range of about 0 degrees to about 90 degrees. In one example, the angle may be 5 degrees.

The process 180 may further include removing a portion of the exposed surface of the workpiece with a second laser beam at 192. Removing a portion of the exposed surface of the workpiece at 192 may include shaping the exposed surface. Shaping the exposed surface may include, for example, angling the surface, curving the surface, forming a pattern in the surface, etc. Removing the portion of the exposed surface at 192 may include cleaning the exposed surface. Cleaning the exposed surface may include, for example, removing impurities, particles, conductors, or other materials from the exposed surface. In one example, cleaning the exposed surface includes removing conductive particles from the exposed surface. Removing the portion of the exposed surface of the workpiece may include etching a recess at a conductor disposed on the exposed surface of the workpiece.

The second laser beam may be a lower intensity than the first laser beam. The first laser beam may be emitted by a first emitter and the second laser beam may be emitted by a second emitter. Alternatively, the first laser beam may be emitted by an emitter and the second laser beam may be emitted by the emitter and directed to the exposed surface by a mirror. An angle of the mirror may be controllable to change an angle of the second laser beam relative to a normal to a major surface of the workpiece.

In one example, the first laser beam may be emitted at a first angle relative to a normal to a major surface of the workpiece and the second laser beam may be emitted at a second angle relative to the normal to the major surface of the workpiece. The first angle may be in a range of about 0 degrees to about 20 degrees. In one example, the angle may be no greater than 10 degrees.

FIGS. 10A-10D are schematic side views of embodiments 200A-200D of laser cutting of workpieces 202A-202D. For ease of discussion, each common element with regard to FIGS. 10A-10D having a reference numeral with an alphabetic suffix (e.g., A, B, C, or D) may be referred to collectively using only the numerical reference. For example, workpieces 202A-202D may be referred to as workpieces 202. Each of embodiments 200 of laser cutting workpieces 202 may be cut or formed by any of the laser cutting systems described herein. Each of embodiments 200 may include a workpiece 202, a first laser 204, a second laser 205, an exposed surface 206, a major surface 210, and a normal 212 to the major surface. Embodiments 200A and 200B may include one or more conductors 208.

Figure 10A:
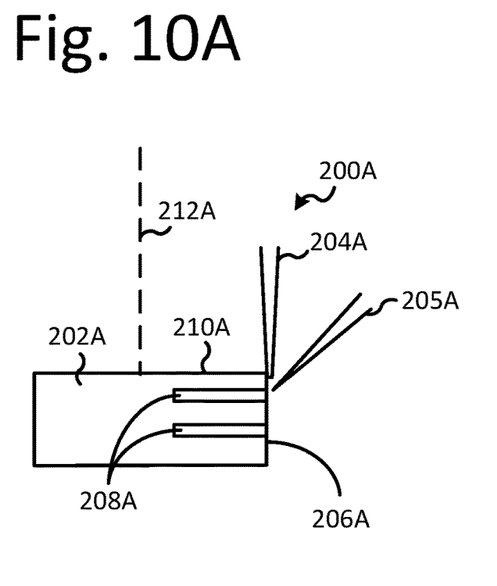
FIG. 10A is a schematic side view of an embodiment of laser cutting a workpiece.
Figure 10B:
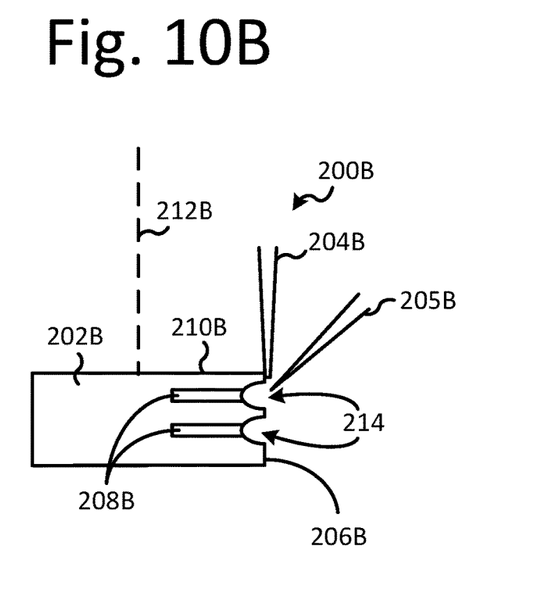
FIG. 10B is a schematic side view of another embodiment of laser cutting a workpiece.

The first laser 204 may be used to remove a portion of the workpiece 202 to form an exposed surface 206. The second laser beam 205 may be used to clean the exposed surface 206 as depicted in FIG. 10A. For example, the second laser beam 205 may be used to remove conductive materials, burrs, residue, powders, particles, or other materials may be removed from the exposed surface 206. Cleaning the exposed surface 206 may prevent unwanted electrical leakage. Furthermore, the second laser beam 205 may be used to form recesses 214 as depicted in FIG. 10B. The recesses 214 may increase the distance through open air or space between exposed surfaces of the conductors 208. This extra distance may improve the electrical performance of the workpiece by preventing electrical leakage of the workpiece 202.

Figure 10C:
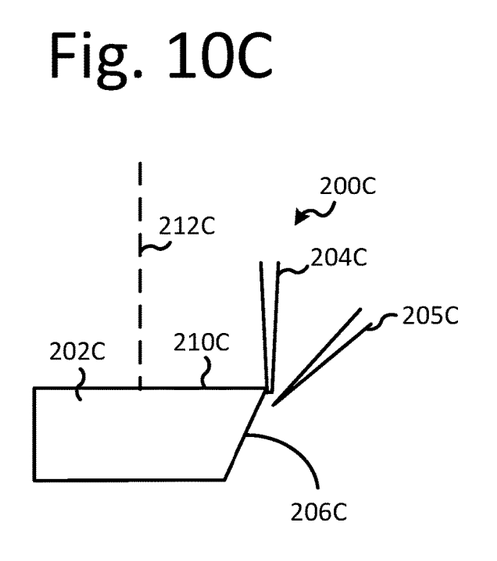
FIG. 10C is a schematic side view of another embodiment of laser cutting a workpiece.
Figure 10D:
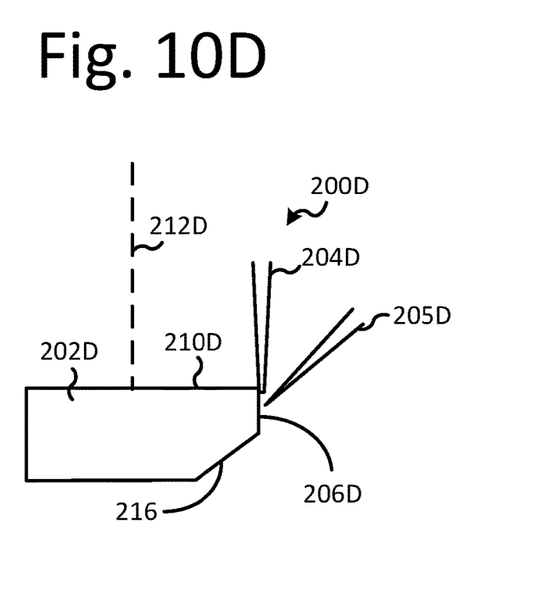
FIG. 10D is a schematic side view of another embodiment of laser cutting a workpiece.

The second laser beam 205 may also be used for shaping the workpiece 202. For example, the second laser beam 205 may be used to taper exposed surface 206 as depicted in FIG. 10C. Further for example, the second laser beam 205 may be used to form a chamfered surface 216 as depicted in FIG. 10D. The second laser beam 205 may be used to form the workpiece to any suitable size or shape.

It should be understood that various aspects disclosed herein can be combined in different combinations than the combinations specifically presented in the description and accompanying drawings. It should also be understood that, depending on the example, certain acts or events of any of the processes or methods described herein can be performed in a different sequence, can be added, merged, or left out altogether (e.g., all described acts or events can not be necessary to carry out the techniques). In addition, while certain aspects of this disclosure are described as being performed by a single module or unit for purposes of clarity, it should be understood that the techniques of this disclosure can be performed by a combination of units or modules associated with, for example, a medical device.

In one or more examples, the described techniques can be implemented in hardware, software, firmware, or any combination thereof. If implemented in software, the functions can be stored as one or more instructions or code on a computer-readable medium and executed by a hardware-based processing unit. Computer-readable media can include computer-readable storage media, which corresponds to a tangible medium such as data storage media (e.g., RAM, ROM, EEPROM, flash memory, or any other medium that can be used to store desired program code in the form of instructions or data structures and that can be accessed by a computer).

Instructions can be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" as used herein can refer to any of the foregoing structure or any other physical structure suitable for implementation of the described techniques. Also, the techniques could be fully implemented in one or more circuits or logic elements.

All references and publications cited herein are expressly incorporated herein by reference in their entirety into this disclosure, except to the extent they may directly contradict this disclosure. Illustrative embodiments of this disclosure are discussed, and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. A method comprising:
    removing a portion of a workpiece including removing a first portion of a conductor from the workpiece with a first laser beam to form an exposed surface of the workpiece, wherein a second portion of the conductor is positioned along the exposed surface of the workpiece;
    detecting plasma illumination caused by removal of the first portion of the conductor from the workpiece;
    determining a position of the second portion of the conductor along the exposed surface of the workpiece based on the detected plasma illumination;
    determining an angle relative to a normal to a major surface of the workpiece to emit a second laser beam based on the determined position of the second portion of the conductor; and
    removing a portion of the exposed surface of the workpiece with the second laser beam, the second laser beam emitted or reflected at the angle relative to the normal to the major surface.

2. The method of claim 1, wherein removing the portion of the exposed surface comprises cleaning the exposed surface.

3. The method of claim 2, wherein cleaning the exposed surface comprises removing conductive particles from the exposed surface.

4. The method of claim 1, wherein the second laser beam comprises a lower intensity than the first laser beam.

5. The method of claim 1, wherein the first laser beam is emitted by a first emitter and the second laser beam is emitted by a second emitter.

6. The method of claim 1, wherein the first laser beam is emitted by an emitter and the second laser beam is emitted by the emitter and the second laser beam is directed to the exposed surface by a mirror.

7. The method of claim 6, wherein an angle of the mirror is controllable to change an angle of the second laser beam relative to the normal to the major surface of the workpiece.

8. The method of claim 1, wherein the first laser beam is emitted at a first angle relative to the normal to the major surface of the workpiece and the second laser beam is emitted at a second angle relative to the normal to the major surface of the workpiece.

9. The method of claim 8, wherein the first angle is no greater than 10 degrees.

10. The method of claim 1, wherein removing the portion of the workpiece comprises disposing a recess in the workpiece.

11. The method of claim 1, wherein removing the portion of the exposed surface of the workpiece comprises shaping the exposed surface.

12. The method of claim 1, wherein removing the portion of the exposed surface of the workpiece comprises etching a recess at the conductor disposed on the exposed surface of the workpiece.

13. The method of claim 1, wherein removing the portion of the workpiece comprises cutting the workpiece into one or more singulated electronic packages.

14. A system comprising:
an emitting device adapted to emit a first laser beam and a second laser beam;
a controller comprising one or more processors and operably coupled to the emitting device to control emission of the first and second laser beams, the controller adapted to remove a portion of a workpiece to form an exposed surface of the workpiece with the first laser beam using the emitting device and to remove a portion of the exposed surface with the second laser beam using the emitting device; and
an optical sensor adapted to detect plasma illumination, wherein the controller is further adapted to:
determine a position of a portion of a conductor positioned along the exposed surface of the workpiece based on plasma illumination emitted when the first laser beam contacts the conductor; and
determine an angle relative to a normal to a major surface of the workpiece to emit the second laser beam based on the determined position of the portion of the conductor.

15. The system of claim 14, wherein the controller is further adapted to control the emitting device to emit the second laser beam at a lower intensity than the first laser beam.

16. The system of claim 14, wherein the emitting device comprises:
a first emitter adapted to emit the first laser beam; and
a second emitter adapted to emit the second laser beam.

17. The system of claim 14, further comprising a mirror, wherein the controller is further adapted to control the emitting device to direct at least one of the first and second laser beams to the mirror, wherein the mirror is adapted to direct the at least one of the first and second laser beams to the workpiece.

18. The system of claim 17, wherein the controller is operably coupled to the mirror to control an angle of the mirror.

19. The system of claim 14, wherein the controller is further adapted to control the emitting device to emit the first laser beam at a first angle relative to the normal to the major surface of the workpiece and the second laser beam at a second angle relative to the normal to the major surface of the workpiece.

20. The system of claim 19, wherein the first angle is no greater than 10 degrees.

21. The system of claim 14, further comprising a beam splitter, wherein the controller is further adapted to control the emitting device to emit the first and second laser beams simultaneously using the beam splitter.

* * * * *